(12) United States Patent
Cai et al.

(10) Patent No.: US 6,310,380 B1
(45) Date of Patent: Oct. 30, 2001

(54) ELECTROSTATIC DISCHARGE PROTECTION TRANSISTOR STRUCTURE WITH A TRENCH EXTENDING THROUGH THE SOURCE OR DRAIN SILICIDE LAYERS

(75) Inventors: Jun Cai; Keng Foo Lo, both of Singapore (SG)

(73) Assignee: Chartered Semiconductor Manufacturing, Inc., Milpitas, CA (US)

( * ) Notice: Subject to any disclaimer, the term of this patent is extended or adjusted under 35 U.S.C. 154(b) by 0 days.

(21) Appl. No.: 09/519,838

(22) Filed: Mar. 6, 2000

(51) Int. Cl.$^7$ .................................................. H01L 23/62
(52) U.S. Cl. .................. 257/355; 257/355; 257/356; 257/357; 257/358; 257/359; 257/360; 257/361; 257/362; 257/363
(58) Field of Search ..................... 257/335, 336, 257/339, 355, 356, 357, 358, 359, 360, 361, 362, 363

(56) References Cited

U.S. PATENT DOCUMENTS

| | | | |
|---|---|---|---|
| 5,504,362 | * 4/1996 | Pelella et al. | ............ 257/357 |
| 5,534,450 | * 7/1996 | Kim | ............ 437/34 |
| 5,976,921 | 11/1999 | Maeda | ............ 438/202 |
| 5,982,600 | 11/1999 | Cheng et al. | ............ 361/111 |

FOREIGN PATENT DOCUMENTS

03155679 * 7/1991 (JP).

* cited by examiner

Primary Examiner—Nathan Flynn
Assistant Examiner—Ahmed N. Sefer
(74) Attorney, Agent, or Firm—Mikio Ishimaru

(57) ABSTRACT

A MOS transistor structure is provided for ESD protection in an integrated circuit device. A trench controls salicide deposition to prevent hot spot formation and allows control of the turn-on voltage. The structure includes source and drain diffusion regions formed in the silicon substrate, a gate, and n-wells formed under the source and drain diffusions on either side of the gate. A drain trench is located to separate the salicide between a drain contact and the gate edge, and by controlling the size and location of the drain trench, the turn-on voltages can be controlled; i.e., the turn-on voltage due to drain diffusion region to substrate avalanche breakdown and the turn-on voltage due to source well to drain well punch-through. Thus, very low turn-on voltages may be achieved for ESD protection.

20 Claims, 1 Drawing Sheet

ELECTROSTATIC DISCHARGE PROTECTION TRANSISTOR STRUCTURE WITH A TRENCH EXTENDING THROUGH THE SOURCE OR DRAIN SILICIDE LAYERS

TECHNICAL FIELD

The present invention relates to electrostatic discharge protection transistor structures and more particularly to electrostatic discharge protection transistor structures using shallow trench isolation.

BACKGROUND OF THE INVENTION

Electrostatic discharges (ESDs) are caused by high-voltage spikes of static charges. Damage from electrostatic discharge is a significant failure mechanism in modern integrated circuits, particularly as integrated circuit physical dimensions continue to shrink to the submicron range.

A major source of ESD is from the human body. A charge of about 0.6 muC can be induced on a body capacitance of 150 pF leading to electrostatic potentials of 4 kV or greater. Any contact by a charged human body with a grounded object, such as the pin of an integrated circuit, can result in a discharge in about 100 nseconds with peak currents of several amperes to the integrated circuit. This is described as the "human body model", or HBM, ESD source.

A second source of ESD is from metallic objects. The metallic object ESD source is characterized by a greater capacitance and a lower internal resistance with ESD transients having significantly higher rise times than the HBM ESD source. This is described as the "machine model", or MM, ESD source.

A third ESD source is from the integrated circuit itself. The integrated circuit becomes charged and discharges to ground. Thus, the ESD discharge current flows in the opposite direction in the integrated circuit than that of the HBM ESD source and the MM ESD source. This is described as the "charged device model", or CDM, ESD source.

Electrically, an ESD occurs upon contact of one or more of the terminals of an integrated circuit with a body or material that is statically charged to a high voltage. This level of static charge is readily generated by the triboelectric effect, and other mechanisms acting upon humans, equipment, or the circuits themselves. Upon contact, the integrated circuit discharges through its active devices and DC current paths. If the amount of charge is excessive however, the discharge current density can permanently damage the integrated circuit so that it is no longer functional or so that it is more prone to later-life failure. ESD damage thus is a cause of yield loss in manufacturing and also poor reliability in use.

Currently, it is a common practice in the art to implement ESD protection devices connected to the external terminals of the circuit. ESD protection devices are designed to provide a current path of sufficient capacity to safely discharge the current applied by a charged body in an ESD, but not to inhibit functionality of the integrated circuit in normal operation. The addition of ESD protection devices necessarily adds parasitic effects that degrade circuit performance. In some cases such as in series resistors, the ESD protection devices directly add delay to the electrical performance.

Accordingly, it is a desirable goal for ESD protection devices to provide a high-capacity current path, which is readily turned-on during an ESD, but which can never turn-on during normal operation and which presents minimal effect on circuit performance.

In the past, n-type metal oxide semiconductor (NMOS) transistors have been widely used as ESD protection devices in semiconductor integrated circuit devices. However, with these transistors, it is well know to those skilled in the art that salicidation (self-aligned siliciding) of the drain and the source junctions reduces ESD performance significantly. From the ESD viewpoint, the primary effect of the salicidation is to bring a transistor drain or a source contact closer to its diffusion edge near their respective gate edge. The consequence is that under high current conditions, the ballasting resistance between the drain or the source contact and their respective gate edge is reduced and the current path\ cause "hot spot" formation, usually at the gate edge. Once a hot spot is formed, there is very little resistance to prevent current localization through the hot spot and so most of the current flows through the silicide to the gate edge. This leads to higher power dissipation and damage in this region. Also, the high power dissipation through the drain or source silicide can cause damage at the drain or source contact when the eutectic temperature is exceeded.

The most conventional solution to the salicidation problem is to add an additional photolithographic process step, called a "salicide block". Most salicidation fabrication technology processes have a salicide block option which blocks the formation of silicide in areas close to a transistor's gate edge. Without the gate edge silicide, an ESD implantation is required make the drain junction deeper as well as to overdope the lightly doped region of the LDD for better ESD performance. Since the ESD implantation is undesirable in the circuitry being protected, an ESD implant block would be required over the non-ESD circuitry. Thus, this approach adds to process complexity because it requires at least two additional photolithographic process steps; i.e., the silicide block and the ESD implant block.

Another way to provide ESD protection is to use a grounded gate thin oxide n-type MOS (GGNMOS) transistor. In the GGNMOS transistor, the voltage necessary to turn the transistor on (the turn-on voltage) is reached before the occurrence of an avalanche breakdown due to voltage across the gate oxide of the transistor. Unfortunately, as these transistors continue to shrink in size down to the deep-quarter-micron geometry level, the gate oxide becomes so thin that the gate oxide breakdown voltage approaches the turn-on voltage. Thus, the protection window tends to go to zero and at a small enough geometry will provide no protection at all.

Therefore, it is critical that a new form of ESD protection circuit be developed for smaller integrated circuit geometries that is compatible with saliciding technology without adding process complexity or cost.

DISCLOSURE OF THE INVENTION

The present invention provides a transistor structure for ESD protection in an integrated circuit device. A trench controls salicide deposition to prevent hot spot formation and allows control of the turn-on voltage. The structure includes source and drain diffusion regions formed in the silicon substrate, a gate, and n-wells formed under the source and drain diffusion regions on either side of the gate. A drain trench is located to separate the salicide between a drain contact and the gate edge, and by controlling the size and location of the drain trench, the turn-on voltages can be controlled; i.e., the turn-on voltage due to drain diffusion region to substrate avalanche breakdown and the turn-on voltage due to drain well to source well punch-through. Thus, very low turn-on voltages may be achieved for ESD protection.

The present invention provides a transistor structure for ESD protection in an integrated circuit device. A trench is used to block the salicide formation and to control the turn-on voltage by n-well punch-through. The structure includes source and drain diffusion regions formed in the silicon substrate, a gate, and n-wells formed under the source and drain diffusions on either side of the gate. A source trench is located between a source contact and the gate edge to reduce current localization and prevent hot spot formation during a CDM ESD, and to reduce positive ESD pulses turn-on voltages from drain to source during a HMB ESD.

The present invention further provides a transistor structure for an ESD protection circuit in an integrated circuit device that has uniform current flow through the structure and is not subject to hot spot formation.

The present invention further provides a transistor structure for an ESD protection circuit in an integrated circuit device that is compatible with self-aligned silicide fabrication technology without adding any process complexity or cost.

The present invention further provides a transistor structure for an ESD protection circuit in an integrated circuit device that has a low turn-on voltage for sub-deep-quarter-micron process applications.

The above and additional advantages of the present invention will become apparent to those skilled in the art from a reading of the following detailed description when taken in conjunction with the accompanying drawings.

BEST MODE FOR CARRYING OUT THE INVENTION

Structure

Figure 1:
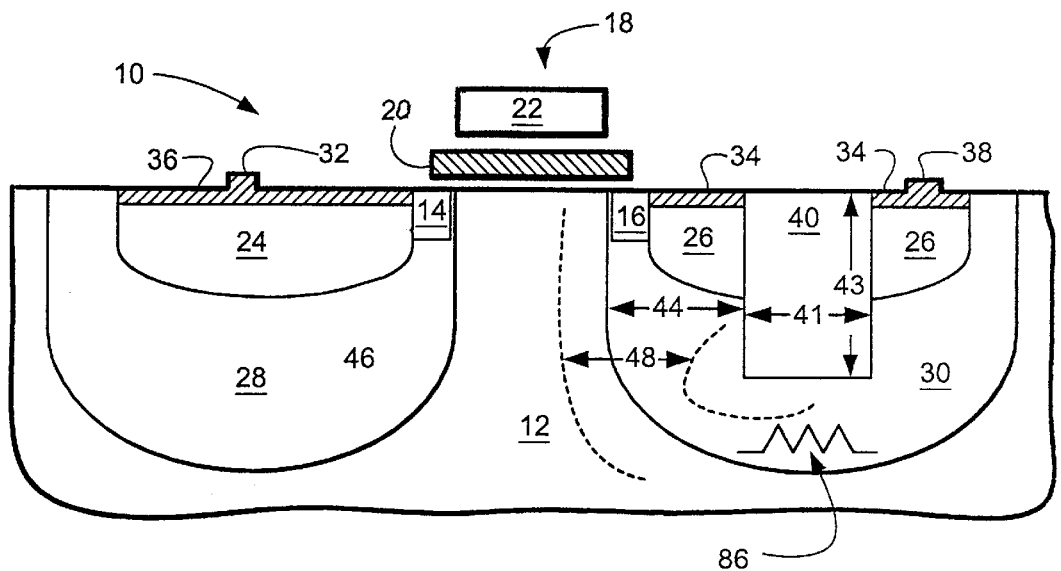
FIG. 1 is a cross-sectional schematic of a semiconductor structure of the present invention.

Referring now to FIG. 1, therein is shown a semiconductor device, such as a trench dual-gate Metal Oxide Semiconductor (TDMOS) transistor device 10, to provide electrostatic discharge (ESD) protection for integrated circuits, and more particularly to integrated circuits having geometries below 0.25 micron.

The TDMOS transistor device 10 is formed in and on a semiconductor substrate, such as a silicon substrate 12, which is a p-substrate in the present invention. The silicon substrate 12 has an implanted lightly doped source extension junction 14 and an implanted lightly doped drain extension junction 16. A gate 18 consisting of a gate dielectric, such as a gate oxide 20, and a semiconductor gate, such as a polysilicon gate 22, are formed over the silicon substrate 12 slightly over and between the source extension junction 14 and the drain extension junction 16. A source diffusion region, such as an n+ source diffusion region 24, and a drain diffusion region, such as an n+ drain diffusion region 26, are respectively implanted into the source extension junction 14 and the drain extension junction 16.

As part of the present invention, diffusion wells, such as a source n-well 28 and a drain n-well 30, are formed under the source diffusion region 24 and the drain diffusion region 26, respectively, to overdope the source extension junction 14 and the drain extension junction 16, respectively. A salicidation (self-aligned siliciding) process is used to form a source salicide 36 and a drain salicide 34 of a metal silicide, such titanium silicide, over the source diffusion region 24 and the drain diffusion region 26, respectively. The source salicide 36 and the drain salicide 34 have a source contact 32 and a drain contact 38 respectively connected to them. The source contact 32 and the drain contact 38 are generally of a conductive material, such as tungsten.

The silicon substrate 12 further has a drain trench 40 formed in it from the surface of the silicon substrate 12 through the drain diffusion region 26 and into the drain n-well 30. The drain trench 40 is an insulator, such as a trench oxide, and is located between the drain contact 38 and the edge of the gate 18. The drain trench 40 has a width 41, a depth 43, and is located a distance 44 from the edge of the drain n-well 30 which is nearest the edge of the gate 18. The volume of the drain n-well 30 around the bottom of the drain trench 40 defines a drain n-well resistive region 86 which is schematically represented by the ballasting resistance designated by the same number in FIG.1 and forms a drain depletion region 48 which is schematically indicated by the arrow designated by the same number in FIG. 1.

Figure 2:
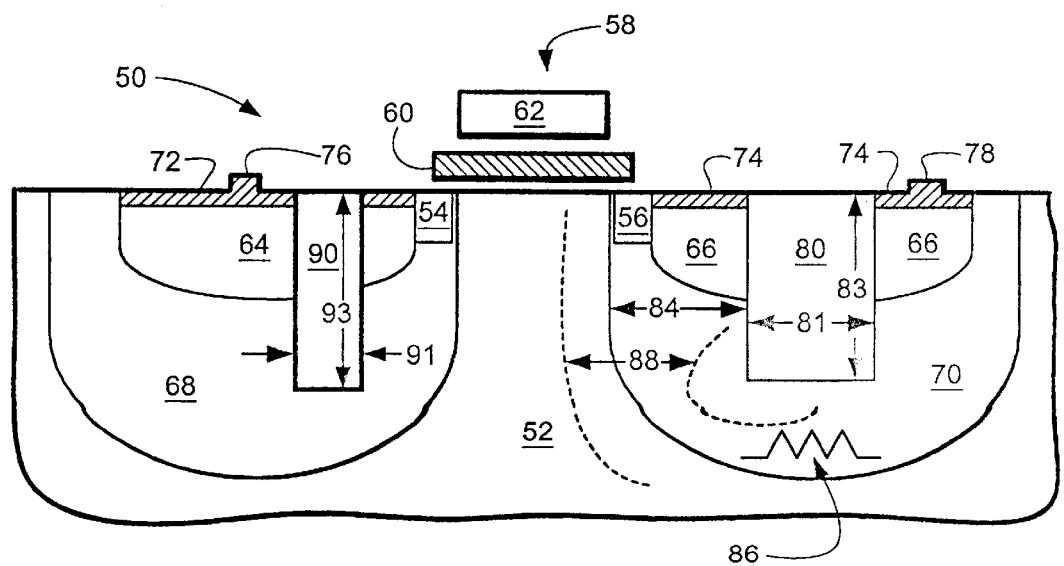
FIG. 2 is a cross-sectional schematic of an alternate embodiment semiconductor structure of the present invention.

Referring now to FIG. 2, therein is shown a semiconductor device, such as a TDMOS transistor device 50 to provide CDM and HBM ESD protection for integrated circuits, and more particularly to integrated circuits having geometries below 0.25 micron.

The TDMOS transistor device 50 is formed in and on a semiconductor substrate, such as a silicon substrate 52. The silicon substrate 52 has an implanted lightly doped source extension junction 54 and an implanted lightly doped drain extension junction 56. A gate 58 consisting of a gate dielectric, such as a gate oxide 60, and a semiconductor gate such as a polysilicon gate 62, are formed over the silicon substrate 52 slightly over and between the source extension junction 54 and the drain extension junction 56. A source diffusion region, such as an n+ source diffusion region 64, and a drain diffusion region, such as an n+ drain diffusion region 66, are respectively implanted into the source extension junction 54 and the drain extension junction 56.

Again as part of the present invention, diffusion wells, such as a source n-well 68 and a drain n-well 70, are formed under the source diffusion region 64 and the drain diffusion region 66, respectively. A salicidation process is used to form a source salicide 72 and a drain salicide 74 of a metal silicide, such titanium silicide, over the source diffusion region 64 and the drain diffusion region 66, respectively. The source salicide 72 and the drain salicide 74 have a source contact 76 and a drain contact 78 respectively connected to them. The source contact 76 and the drain contact 78 are generally of a conductive material, such as tungsten.

The silicon substrate 52 further has a drain trench 80 formed in it from the surface of the silicon substrate 52 through the drain diffusion region 66 and into the drain n-well 70. The drain trench 80 is an insulator, such as a trench oxide, and is located between the drain contact 78 and the edge of the gate 58. The drain trench 80 has a width 81, a depth 83, and is located a distance 84 from the edge of the drain n-well 70 which is nearest the edge of the gate 58. The volume of the drain n-well 70 around the bottom of the drain trench 80 defines a drain n-well resistive region 86 which is schematically represented by the resistor designated by the same number in FIG. 2 and forms a drain depletion region 88 which is schematically indicated by the arrow designated by the same number in FIG. 2.

The silicon substrate 52 further has a source trench 90 formed in it from the surface of the silicon substrate 52 through the source diffusion region 64 and into the source n-well 68. The source trench 90 is an insulator, such as a trench oxide, and is located between the source contact 76 and the edge of the gate 58. The source trench 90 has a width 91, a depth 93, and is located a distance 94 from the edge of the source n-well 68 which is nearest the edge of the gate 58.

Operation

In the operation of the TDMOS transistor device 10 of FIG. 1, the drain trench 40 blocks the drain salicide 34 from being continuous from the drain contact 38 to the gate 18. This forces the current to flow from the drain contact 38 into the drain salicide 34 and into the drain diffusion region 26. The depth of the drain trench 40 blocks the current flow through the drain diffusion region 26 directly to the drain extension junction 16 and forces the flow into the drain n-well 30. This increases the diffusion resistance of the entire drain area by forming the drain n-well resistive region 46. From the drain n-well resistive region 46, the current flows to the drain extension junction 16.

The above arrangement eliminates the need for the conventional silicide block of the drain salicide 34 while still retaining its advantage of preventing hot spot formation at the drain extension junction 16 due to current localization. Further, the diffusion resistance of the drain n-well resistive region 46 related to ESD protection is increased to about 2 to 3 $\mu$m length of drain diffusion resistance for a 0.25 $\mu$m process and will be proportional for smaller geometries (between eight and twelve times and preferably around ten times the size geometry of the device), which also helps to prevent current localization. At the same time, the drain n-well 30 eliminates the need for an ESD implant mask and an ESD implant, usually PMOS in the n-well region and NMOS in the p-well region.

There are two turn-on mechanisms for the TDMOS transistor device 10. One is by the avalanche breakdown of the drain n-well 30 to silicon substrate 12. The other one is by the punch-through of the source n-well 28 to the drain n-well 30. The voltage at which turn-on occurs is variously referred to as the avalanche breakdown voltage, punch-through voltage, turn-on voltage, device snap-back voltage, or device trigger voltage.

The avalanche breakdown mechanism and the related device turn-on voltage occurs as the drain voltage is increased from 0 V. The reverse-biased drain n-well 30 to silicon substrate 12 junction is in high impedance. Eventually, the electromagnetic field (EMF or E-field) across the drain depletion region 48 spanning the drain n-well 30 to silicon substrate 12 junction becomes high enough to begin avalanche multiplication and the junction goes into avalanche breakdown with the generation of electron-hole pairs. The generated electrons are swept across the drain n-well 30 towards the drain contact 38, giving rise to a substrate current, similar to the base current for a parasitic npn bipolar transistor having an n-source, p-substrate and n-drain. As the substrate current increases (as a function of effective substrate resistance, n-well resistance and drain voltage), the potential at the source n-well 28 to silicon substrate 12 junction increases thereby forward-biasing this junction and emitting electrons into the silicon substrate 12. When the electron current density from the source n-well 28 begins to contribute to the drain current, the parasitic npn bipolar transistor can be considered turned on.

In the present invention, the avalanche breakdown voltage can be controlled by controlling the E-field profile across the drain depletion region 48. This is accomplished by adjusting the distance 44 from the drain trench 40 to edge of the drain n-well 30 which is nearest the edge of the gate 18. The avalanche breakdown voltage will decrease as the drain trench 40 is positioned nearer to the edge of the drain n-well 30.

Also, the resistance of the drain n-well 30 is determined primarily by the trench width 41 as well as the distance 44 and secondarily by the trench depth 43. The n-well resistance also affects the substrate current. This means the n-well resistance will have an effect in the avalanche breakdown speed, which affects the avalanche breakdown voltage. Thus, n-well resistance (as controlled by adjusting the doping concentration), the distance 44 and the trench width 41 all must be considered when reducing the turn-on voltage. However, these three factors are can only be reduced by a certain extent since the ballasting resistance of the drain n-well resistive region 46 must be maintained at a certain level to avoid hot spot formation. Therefore, there is a trade-off between them to obtain the lowest avalanche breakdown voltage.

The punch-through mechanism and the related device turn-on voltage occurs as the drain voltage increases, the drain depletion region 48 will increase and can reach (or punch-through the source depletion region (not shown) before the avalanche breakdown occurs.

In this case, ESD discharge current can flow from the drain contact 38 to source contact 32 through the punch-through depletion region with a very low discharge resistance.

However, if the source n-well 28 and the drain n-well 30 are too close, at the normal operating condition drain voltage, there will be a large leakage in the TDMOS transistor device 10. If the source n-well 28 and the drain n-well 30 are spaced too far apart, the punch-through voltage is too high, that means the device turn-on voltage is too high. So, there is also a trade-off between them to obtain the lowest punch-through voltage.

One additional advantage of the present invention is that the punch-through occurs deeper in the silicon substrate 12. Since the turn-on action takes place deeper in the silicon substrate 12 and the peak heating is localized further away from the silicon surface compared to the traditional n-type MOS transistor, which influences the onset of current localization. The TDMOS transistor device 10 increases the diffusion resistance of the drain diffusion region 26 to a level suitable for ESD current protection. Further, in a short-channel device, the maximum length of the drain depletion region 48 (which determines the breakdown voltage) maybe larger than the channel length (the distance between the source extension junction 14 and the drain extension junction 16). In this case, after source-drain punch-through, the drain depletion region 48 is clamped by the channel length when the drain voltage continue to increase. The E-field in the channel length increases much more after source-drain punch-through, resulting in a low voltage drain breakdown, which is less than the drain-substrate avalanche breakdown.

In the operation of the TDMOS transistor device 50 of FIG. 2, the drain trench 80 blocks the drain salicide 74 from being continuous from the drain contact 78 to the gate 58. This forces the current to flow from the drain contact 78 into the drain salicide 74 and into the drain diffusion region 66. The depth of the drain trench 80 blocks the current flow through the drain diffusion region 66 directly to the drain extension junction 56 and forces the flow into the drain n-well 70. This increases the diffusion resistance of the entire drain area by forming the drain n-well resistive region 86. From the drain n-well resistive region 86, the current flows to the drain extension junction 56.

The above arrangement for the TDMOS transistor device 50 operates in the same fashion as the same arrangement for the TDMOS transistor device 10 and has the same advantages and design considerations.

In addition, the TDMOS transistor device 50 is provided with the source trench 90 to reduce hot spot formation in the source salicide 72 from a charged device model (CDM) ESD source. With a CDM ESD, the discharge current flows from the substrate to the source contact 76.

Sometimes, the substrate floating effect is used to reduce positive ESD pulse trigger-on voltage from a human body model (HBM) ESD source. The discharge path is from the source contact 76 to the drain contact 78 so the sizing of the width 91 and the distance 94 of the source trench 90 has the same parameters for establishing the turn-on voltages as previously described for the drain trench 40.

The TDMOS transistor devices 10 and 50 may be fabricated in a salicide technology based fabrication procedure that is completely compatible with the salicide technology used for making of current integrated circuit devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An electrostatic discharge protection transistor comprising:
   a semiconductor substrate, the semiconductor substrate having source and drain diffusion regions, the semiconductor substrate having respective source and drain wells under the source and drain diffusion regions, the semiconductor substrate having lightly doped regions in the source and drain wells;
   a gate formed over the semiconductor substrate covering portions of the lightly doped source and drain junctions;
   source and drain silicides respectively formed on the source and drain diffusion regions;
   source and drain contacts respectively connected to the source and drain suicides; and
   a drain trench in the semiconductor substrate separating the drain silicide between the drain contact and the gate, the drain trench extending though the drain diffusion region into the drain well.

2. The electrostatic discharge protection transistor as claimed in claim 1 wherein:
   the drain well doping concentration is controlled when forming a resistive region in the drain well under the drain trench; and
   the drain trench permits avalanche breakdown between the drain well and the semiconductor substrate while having the resistive region doped to form a ballasting resistance whereby hot spot formation in the drain silicide is prevented.

3. The electrostatic discharge protection transistor as claimed in claim 1 wherein:
   the drain trench has a width which forms a resistive region in the drain well under the drain trench; and
   the drain trench has a width which permits avalanche breakdown between the drain well and the semiconductor substrate while having the resistive region form a ballasting resistance whereby hot spot formation in the drain suicide is prevented.

4. The electrostatic discharge protection transistor as claimed in claim 1 wherein:
   the drain trench has a width and depth which form a resistive region in the drain well under the drain trench; and
   the drain trench has a width and depth which permit avalanche breakdown between the drain well and the semiconductor substrate while having the resistive region form a ballasting resistance whereby hot spot formation in the drain silicide is prevented.

5. The electrostatic discharge protection transistor as claimed in claim 1 wherein:
   the semiconductor substrate has a drain depletion region extending from the drain well;
   the drain trench affects an electromagnetic field profile across the drain depletion region;
   the drain trench has a position near the gate which forms a resistive region in the drain well under the drain trench; and
   the drain trench has a position near the gate which permits punch-through between the drain well and the source well through the drain depletion region while having the resistive region form a ballasting resistance whereby hot spot formation in the drain silicide is prevented.

6. The electrostatic discharge protection transistor as claimed in claim 1 wherein:
   the drain silicide will have a drain current flow into the drain diffusion region during an electrostatic discharge; and
   the drain diffusion region has a level of diffusion resistance around ten times the size geometry of the electrostatic discharge protection transistor.

7. The electrostatic discharge protection transistor as claimed in claim 1 wherein: the drain trench is an insulator.

8. The electrostatic discharge protection transistor as claimed in claim 1 including:
   a source trench in the semiconductor substrate separating the source silicide between the source contact and the gate; and
   the source trench extending through the source diffusion region into the source well.

9. The electrostatic discharge protection transistor as claimed in claim 8 wherein:
   the semiconductor substrate has a source depletion region;
   the source trench affects an electromagnetic field profile across the source depletion region;
   the source trench has a position near the gate which forms a resistive region in the source well under the source trench; and
   the source trench has a position which permits punch-through between the source well and the drain well through the source depletion region while having the resistive region form a ballasting resistance whereby hot spot formation in the source silicide is prevented.

10. The electrostatic discharge protection transistor as claimed in claim 8 wherein:
    the source trench is an insulator.

11. An electrostatic discharge protection transistor comprising:
    a semiconductor p-substrate, the semiconductor p-substrate having n+ source and n+ drain diffusion regions, the semiconductor p-substrate having respective source and drain n-wells under the n+ source and n+ drain diffusion regions, the semiconductor p-substrate having lightly doped regions in the source and drain n-wells;

a gate formed over the semiconductor p-substrate covering portions of the lightly doped n+ source and n+ drain junctions;

source and drain suicides respectively formed on the n+ source and n+ drain diffusion regions;

n+ source and n+ drain contacts respectively connected to the source and drain suicides; and a drain trench in the semiconductor p-substrate separating the drain silicide between the n+ drain contact and the gate, the drain trench extending through the n+ drain diffusion region into the drain n-well.

12. The electrostatic discharge protection transistor as claimed in claim 11 wherein:

the drain n-well doping concentration is controlled when forming a resistive region in the drain n-well under the drain trench; and the drain trench permits avalanche breakdown between the drain n-well and the semiconductor p-substrate while having the resistive region doped to form a ballasting resistance whereby hot spot formation in the drain silicide is prevented.

13. The electrostatic discharge protection transistor as claimed in claim 11 wherein:

the drain trench has a width which forms a resistive region in the drain n-well under the drain trench; and the drain trench has a width which permits avalanche breakdown between the drain n-well and the semiconductor p-substrate while having the resistive region form a ballasting resistance whereby hot spot formation in the drain silicide is prevented.

14. The electrostatic discharge protection transistor as claimed in claim 11 wherein:

the drain trench has a width and depth which form a resistive region in the drain n-well under the drain trench; and the drain trench has a width and depth which permit avalanche breakdown between the drain n-well and the semiconductor p-substrate while having the resistive region form a ballasting resistance whereby hot spot formation in the drain silicide is prevented.

15. The electrostatic discharge protection transistor as claimed in claim 11 wherein:

the semiconductor p-substrate has a drain depletion region extending from the drain n-well; the drain trench affects an electromagnetic field profile across the drain depletion region;

the drain trench has a position near the gate which forms a resistive region in the drain n-well under the drain trench; and the drain trench has a position near the gate which permits avalanche breakdown between the drain n-well and the source n-well through the drain depletion region while having the resistive region form a ballasting resistance whereby hot spot formation in the drain silicide is prevented.

16. The electrostatic discharge protection transistor as claimed in claim 11 wherein:

the drain silicide will have a drain current flow into the n+ drain diffusion region during an electrostatic discharge; and the n+ drain diffusion region has a level of diffusion resistance between eight and twelve times the size geometry of the electrostatic discharge protection transistor.

17. The electrostatic discharge protection transistor as claimed in claim 11 wherein:

the drain trench is a trench oxide.

18. An electrostatic discharge protection transistor comprising:

a semiconductor p-substrate, the semiconductor p-substrate having n+ source and n+ drain diffusion regions, the semiconductor p-substrate having respective source and drain n-wells under the n+ source and n+ drain diffusion regions, the semiconductor p-substrate having lightly doped regions in the source and drain n-wells;

a gate formed over the semiconductor p-substrate covering portions of the lightly doped n+ source and n+ drain junctions;

source and drain silicides respectively formed on the n+ source and n+ drain diffusion regions;

n+ source and n+ drain contacts respectively connected to the source and drain suicides; and a source trench in the semiconductor p-substrate separating the source silicide between the n+ source contact and the gate, the source trench extending through the n+ source diffusion region into the source n-well.

19. The electrostatic discharge protection transistor as claimed in claim 18 wherein:

the semiconductor p-substrate has a source depletion region;

the source trench affects an electromagnetic field profile across the source depletion region;

the source trench has a position near the gate which forms a resistive region in the source n-well under the source trench; and the source trench has a position which permits punch-through between the source n-well and the drain n-well through the source depletion region while having the resistive region form a ballasting resistance whereby hot spot formation in the source silicide is prevented.

20. The electrostatic discharge protection transistor as claimed in claim 18 wherein:

the source trench is an oxide.

* * * * *